United States Patent
Fedeli et al.

(10) Patent No.: US 12,379,213 B2
(45) Date of Patent: Aug. 5, 2025

(54) MICROELECTROMECHANICAL GYROSCOPE WITH OUT-OF-PLANE DETECTION MOVEMENT

(71) Applicant: STMICROELECTRONICS S.r.l., Agrate Brianza (IT)

(72) Inventors: Patrick Fedeli, Senago (IT); Luca Guerinoni, Alzano Lombardo (IT); Paola Carulli, Milan (IT); Luca Giuseppe Falorni, Limbiate (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 380 days.

(21) Appl. No.: 18/150,720

(22) Filed: Jan. 5, 2023

(65) Prior Publication Data

US 2023/0228570 A1 Jul. 20, 2023

(30) Foreign Application Priority Data

Jan. 14, 2022 (IT) .......................... 102022000000524

(51) Int. Cl.
*G01C 19/5712* (2012.01)
(52) U.S. Cl.
CPC .................................. *G01C 19/5712* (2013.01)
(58) Field of Classification Search
CPC ........ G01C 19/5712; B81B 2201/0242; B81B 7/0048
See application file for complete search history.

(56) References Cited

U.S. PATENT DOCUMENTS

| 6,170,332 B1* | 1/2001 | MacDonald ............ G01P 1/006 73/514.32 |
| 10,274,512 B2* | 4/2019 | Tocchio ................ G01P 15/125 |

(Continued)

FOREIGN PATENT DOCUMENTS

| EP | 3156804 A1 | 4/2017 |
| EP | 3225953 A1 | 10/2017 |

*Primary Examiner* — David J Bolduc
(74) *Attorney, Agent, or Firm* — SEED IP LAW GROUP LLP

(57) ABSTRACT

A microelectromechanical gyroscope is provided with a detection structure having: a substrate with a top surface parallel to a horizontal plane (xy); a mobile mass, suspended above the substrate to perform, as a function of a first angular velocity ($\Omega_x$) around a first axis (x) of the horizontal plane (xy), at least a first detection movement of rotation around a second axis (y) of the horizontal plane; and a first and a second stator elements integral with the substrate and arranged underneath the mobile mass to define a capacitive coupling, a capacitance value thereof is indicative of the first angular velocity ($\Omega_x$). The detection structure has a single mechanical anchorage structure for anchoring both the mobile mass and the stator elements to the substrate, arranged internally with respect to the mobile mass, which is coupled to this single mechanical anchorage structure by coupling elastic elements yielding to torsion around the second axis; the stator elements are integrally coupled to the single mechanical anchorage structure in an arrangement suspended above the top surface of the substrate.

20 Claims, 4 Drawing Sheets

(56) References Cited

U.S. PATENT DOCUMENTS

| | | | |
|---|---|---|---|
| 2005/0262942 A1* | 12/2005 | Samuels | G01P 15/0802 |
| | | | 73/514.01 |
| 2006/0032310 A1* | 2/2006 | Merassi | B81B 7/0048 |
| | | | 257/734 |
| 2012/0006123 A1* | 1/2012 | Walther | G01C 19/5712 |
| | | | 73/774 |
| 2013/0139592 A1* | 6/2013 | Acar | B81C 1/00134 |
| | | | 257/415 |
| 2013/0192369 A1* | 8/2013 | Acar | G01P 15/125 |
| | | | 73/514.01 |
| 2013/0270657 A1* | 10/2013 | Acar | G01C 19/5755 |
| | | | 438/53 |
| 2013/0283913 A1 | 10/2013 | Lin et al. | |
| 2014/0252509 A1* | 9/2014 | Merassi | B81B 3/0072 |
| | | | 257/415 |
| 2016/0257557 A1* | 9/2016 | Wu | G01P 15/125 |
| 2017/0108530 A1* | 4/2017 | Tocchio | G01P 1/00 |
| 2018/0148329 A1* | 5/2018 | Michalik | B81C 1/00301 |
| 2018/0321038 A1* | 11/2018 | Liukku | G01C 25/005 |
| 2019/0145772 A1* | 5/2019 | Acar | G01C 19/5712 |
| | | | 73/504.12 |
| 2021/0215735 A1* | 7/2021 | Tseng | G01P 1/00 |
| 2021/0363000 A1 | 11/2021 | Allegato et al. | |
| 2022/0041429 A1 | 2/2022 | Rizzini et al. | |
| 2022/0194781 A1* | 6/2022 | Partanen | B81B 3/0051 |
| 2023/0160921 A1* | 5/2023 | Gattere | G01P 15/0802 |
| | | | 73/514.32 |

* cited by examiner

MICROELECTROMECHANICAL GYROSCOPE WITH OUT-OF-PLANE DETECTION MOVEMENT

BACKGROUND

Technical Field

The present disclosure relates to a microelectromechanical (MEMS, Micro-Electro-Mechanical Sensor) gyroscope, with out-of-plane detection movement having improved electrical characteristics, in particular having improved stability with respect to stress or external stimuli acting as a disturbance with respect to a quantity (angular velocity) to be detected.

Description of the Related Art

MEMS gyroscopes are known whose detection structure comprises at least one mobile mass, so-called "rotor mass," arranged suspended above a substrate and having a main extension plane parallel, in a rest condition, to a horizontal plane and to a top surface of the same substrate.

When a rotation at a certain angular velocity (whose value is to be detected) is applied to the mobile mass of the MEMS gyroscope, which is being driven with a linear velocity, the mobile mass senses a fictitious force, called the Coriolis force, which determines a displacement thereof in a direction perpendicular to the direction of the linear driving velocity and to the axis around which the rotation occurs. The mobile mass is supported through elastic elements that allow it to displace in the direction of the fictitious force. According to Hooke's law, the displacement is proportional to this fictitious force, thus being indicative of the Coriolis force and of the value of the angular velocity.

In particular, in the present case, with a gyroscope having an out-of-plane movement, the linear driving is implemented along a first axis of the horizontal plane and the angular velocity is detected around a second axis of the horizontal plane, orthogonal to the aforementioned first axis, so that the displacement of the mobile mass due to the Coriolis effect occurs along a direction orthogonal to the same horizontal plane, along a vertical axis z.

The displacement of the mobile mass may for example be detected capacitively, determining, in a resonance condition, the capacitance variations caused by the movement of the mobile mass with respect to fixed detection electrodes, so-called "stator elements," forming with the same mobile mass at least one detection capacitor.

The mobile mass is coupled to a corresponding rotor anchor (integral with the substrate) by elastic elements, which allow its driving movement and its movement for angular velocity detection.

The stator elements are integrally coupled to the substrate by respective stator anchors, so as to be capacitively coupled to the rotor and form the detection capacitor, whose capacitive variation is indicative of the detected angular velocity.

In particular, in the detection structure, the rotor and stator anchors have a dual function, of mechanical anchoring towards the substrate and also of electrical coupling for biasing the corresponding stator elements and the mobile mass and for detecting the capacitive variation signal.

In a known manner, the detection structure of the MEMS gyroscope is housed inside a package, typically together with a corresponding ASIC (Application Specific Integrated Circuit) electronic circuitry; the package is the mechanical and electrical interface of the MEMS gyroscope towards the outside, for example towards an electronic apparatus wherein the same MEMS gyroscope is used.

A problem afflicting MEMS gyroscopes (and in general MEMS sensors having detection structures of a capacitive type) is due to a possible occurrence of measurement errors in case stress and deformations occur, in particular induced in the corresponding detection structure due to the interaction with the package, for example as temperature and/or environmental conditions vary or due to mechanical stresses.

For example, the package of a MEMS sensor is subject to deformations as temperature varies, due to the different coefficients of thermal expansion and to the different values of the Young's modulus of the different materials of which it is made, which might cause corresponding deformations of the substrate of the detection structure contained in the same package; similar deformations may occur due to aging of the materials, or to particular externally-induced stresses, for example when the package is soldered on a printed circuit board, or due to humidity absorption by the materials constituting the same package.

As shown schematically in FIG. 1, in the presence of deformations of the substrate 2, for example due to a thermal stress associated with a temperature gradient, a deformation (or curvature) of the top surface 2a, of the same substrate 2 (FIG. 1 shows this deformation in an accentuated manner, for reasons of clarity of illustration), which may entail a variation of the mutual distance of the stator anchors 3a, 3b (having the stator elements integrally coupled thereto) from a rotor anchor 4 (having the mobile mass of the detection structure elastically coupled thereto) may for example occur, with respect to an initial condition at rest, i.e., in the absence of angular velocity to be detected.

Consequently, an undesired variation of the capacitance of the detection capacitor formed between the same mobile mass and the stator electrodes occurs, in the rest condition, with a resulting variation of the so-called Zero Rate Level (ZRL) of the MEMS gyroscope. This variation is also variable as a function of the temperature, or in general of all those external effects capable of inducing deformations of the same substrate 2.

Essentially, a variation therefore occurs (so-called "drift") of the output signal at rest provided by the MEMS gyroscope, the aforementioned ZRL level, and a resulting error in the angular velocity detection. In general, the phenomena described determine an instability of the detection output provided by the MEMS gyroscope during the life of the same MEMS gyroscope.

To overcome this drawback, various solutions have been proposed, some providing for the mechanical optimization of the detection structure, others providing for an electronic compensation; however, the known solutions are not entirely satisfactory, since in general they are of a complex construction and/or require high energy consumption.

BRIEF SUMMARY

The present solution is directed to provide a MEMS gyroscope that has improved stability and reduced drifts of its electrical characteristics with respect to external stimuli, such as thermal variations, or mechanical or environmental stresses or other external stimuli of various kinds.

The present disclosure is directed to a microelectromechanical gyroscope that includes a substrate with a top surface and a mobile mass suspended over the substrate. First and second stator elements are coupled to the mobile mass and positioned between the mobile mass and the top surface of the substrate. A central mechanical anchorage structure coupling the mobile mass to the substrate and elastic elements coupling the mobile mass to the central mechanical anchorage structure.

BRIEF DESCRIPTION OF THE SEVERAL VIEWS OF THE DRAWINGS

For a better understanding of the present disclosure, a preferred embodiment thereof is now described, purely by way of non-limiting example, wherein.

DETAILED DESCRIPTION

Figure 1:
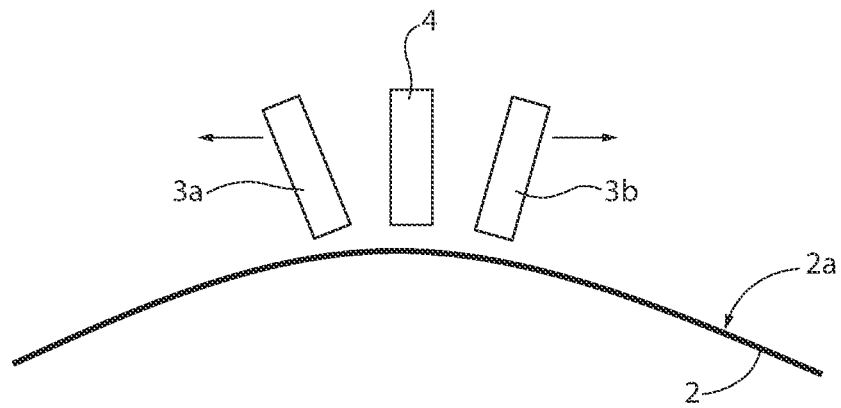
FIG. 1 is a schematic representation relating to a portion of a detection structure of a MEMS gyroscope, in the presence of a deformation of a corresponding substrate.

As will be described in detail below, an aspect of the present solution envisages manufacturing of the detection structure of the MEMS gyroscope in such a way that the mobile mass (rotor) and the fixed electrodes (stator elements), capacitively coupled to the mobile mass to define at least one detection capacitor, are mechanically coupled to the substrate by a single and unique (or monolithic) mechanical anchorage structure in common (integrally coupled to the same substrate); in this manner, possible deformations induced by the package in the substrate are reflected in an equivalent manner on the mobile mass and on the stator elements, making the detection effectively insensitive to deformations, so as to avoid possible modifications in the output signal at rest provided by the same MEMS gyroscope (the so-called drift of the ZRL level).

A distinction is consequently made between mechanical anchors and electrical anchors of at least some of the structural elements defining the detection structure, in particular of the stator elements, by introducing dedicated electrical anchors, distinct from the mechanical anchors, for biasing the same stator elements and for detecting the capacitive variation signal; as will be described below, these electrical anchors are electrically coupled to the single mechanical anchorage structure, so as to define an electrical path for biasing and for detecting the capacitive variation signal, while representing a completely negligible mechanical coupling.

According to an aspect of the present solution, the detection structure comprises two overlying structural layers of semiconductor material (in particular of epitaxial silicon), independent of each other and which are suitably processed (in particular, by trench etchings and removal of sacrificial layers) to define the structural elements of the detection structure, at least partially overlying.

As will be described in detail below, at least part of the mobile mass of the detection structure is defined in a top structural layer and the stator elements and the connection of the same stator elements towards the single anchorage structure, in particular for the integral mechanical coupling of the stator elements to the same single anchorage structure, are defined in a bottom structural layer, arranged underneath the top structural layer (or interposed between the substrate and the same top structural layer).

The manufacturing of the detection structure through the aforementioned overlying structural layers may be carried out for example by the manufacturing process described in detail in US 2021/0363000 A1.

In brief, this process provides for the growth, above a substrate, for example of monocrystalline silicon, of a first epitaxial layer, which is thick, superimposed on a first sacrificial layer, of dielectric material, which is then partially removed by etching (e.g., by hydrofluoric acid vapours). The first sacrificial layer has openings at which anchoring regions to the substrate are defined for the aforementioned first epitaxial layer.

The first epitaxial layer is a first structural layer wherein first trenches (that are empty, or subsequently filled with dielectric material) are formed, for example by silicon dry etching, the first trenches defining structural elements of the detection structure or a bottom part (i.e., closer to the substrate) of the same structural elements; conductive regions (defining pads and electrical interconnections) are formed underneath the first sacrificial layer, at the anchoring regions to the substrate of the aforementioned first epitaxial layer, in order to allow the electrical bias of the aforementioned structural elements.

Subsequently, the manufacturing process provides for the formation of a second sacrificial layer, of dielectric material, above the first epitaxial layer and the definition of the same second sacrificial layer for the formation of sacrificial regions mutually separated by openings.

A second epitaxial layer, having for example a smaller thickness than the first epitaxial layer, is then formed on the same first epitaxial layer and on the sacrificial regions; the second epitaxial layer is in direct contact with the first epitaxial layer at the aforementioned openings and is a second structural layer wherein the structural elements of the detection structure or a top part (i.e., further away from the substrate) of the same structural elements are defined, by the formation of second trenches.

The process then provides for the partial or complete removal of the sacrificial regions, again by etching (for example by hydrofluoric acid vapours), to release, at least partially, the structural elements of the detection structure.

Following this etching, regions of the second epitaxial layer may alternatively: be directly in contact (both mechanically and electrically) with underlying regions of the first epitaxial layer and possibly in contact with the underlying substrate; be separated by an empty region (gap) from the underlying first epitaxial layer, being suspended above the same first epitaxial layer; or be coupled to (and electrically isolated from) the same first epitaxial layer through dielectric regions remaining from the etching of the second sacrificial layer.

Figure 2A:
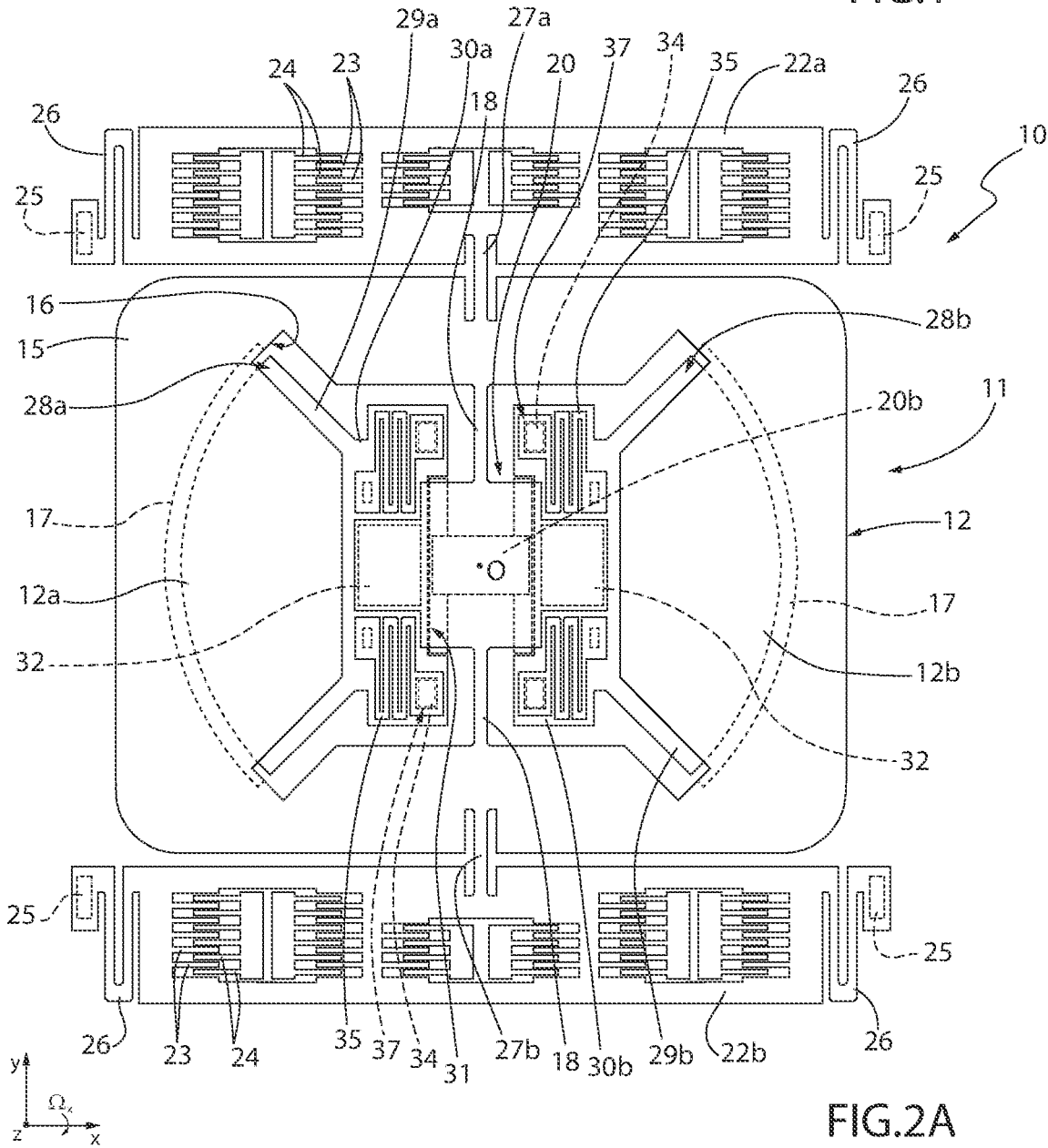
FIG. 2A is a schematic plan view of a detection structure of a MEMS gyroscope, according to a first embodiment of the present solution.
Figure 2B:
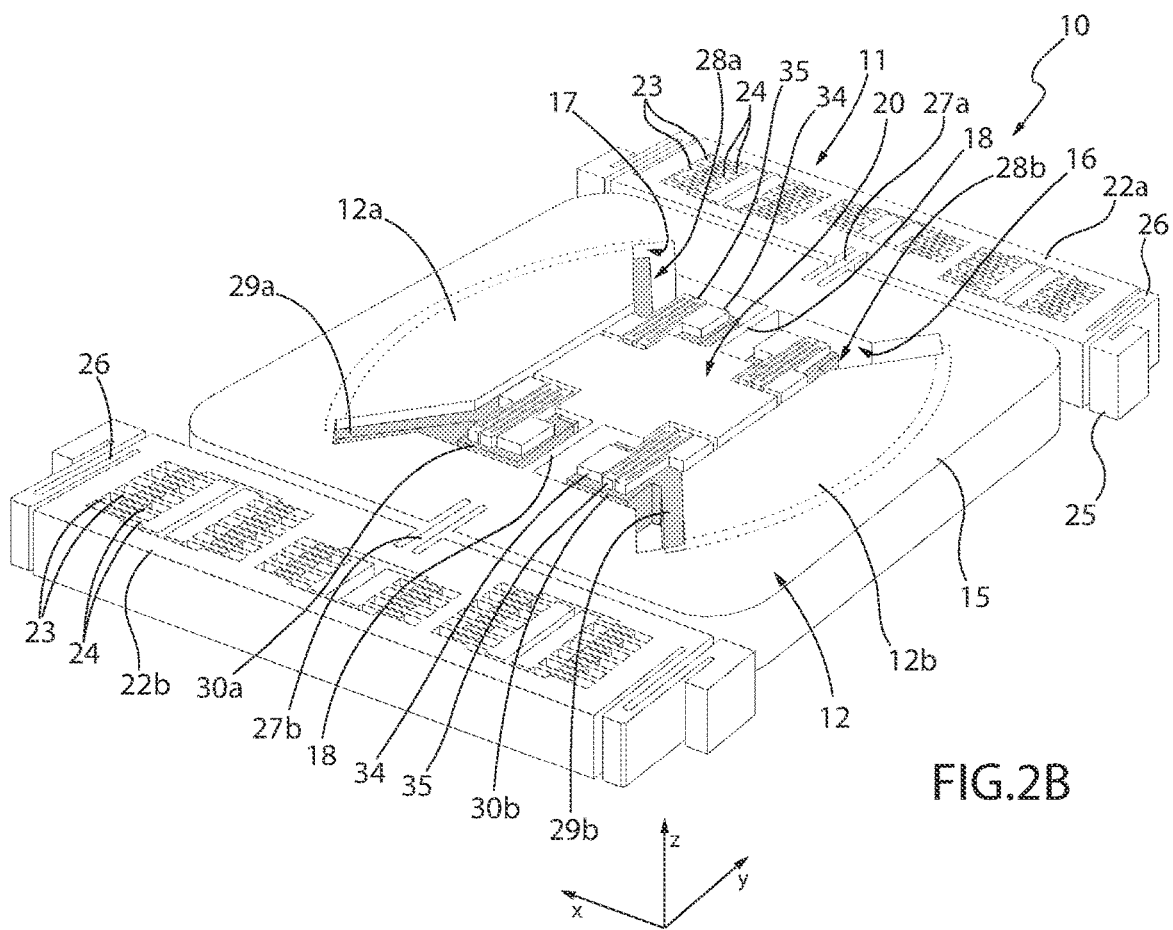
FIG. 2B is a top perspective view of the detection structure of FIG. 2A.
Figure 3:
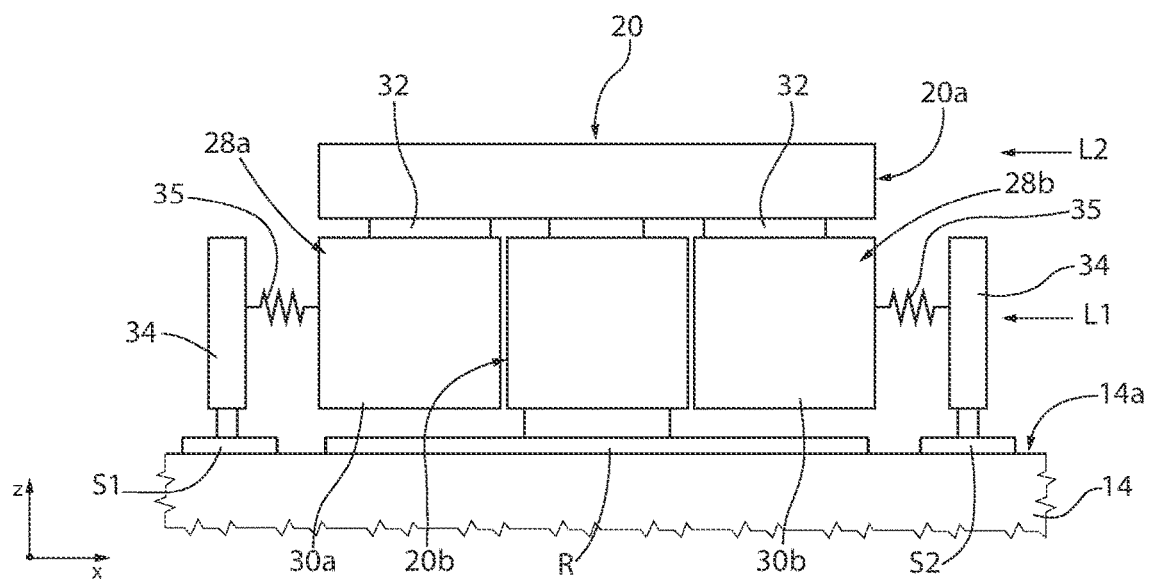
FIG. 3 is a schematic sectional view of an anchorage structure of the MEMS gyroscope of FIGS. 2A and 2B.

With reference to the plan view of FIG. 2A, the perspective view of FIG. 2B and the detailed sectional view of FIG. 3, a first embodiment of the present solution is now described, relating to a microelectromechanical (MEMS)

gyroscope 10 of uniaxial type, for detecting an angular velocity $\Omega_x$ around a first axis x of a horizontal plane xy.

The detection structure 11 of the MEMS gyroscope 10 has a center O and a symmetrical arrangement in the horizontal plane xy, with respect to the first axis x and to a second horizontal axis y.

The detection structure 11 comprises a mobile (or rotor) mass 12, arranged suspended above a substrate 14 of semiconductor material, in particular silicon, having a top surface 14a; at rest, the mobile mass 12 has a main extension in the horizontal plane xy and is arranged parallel to the top surface 14a of the substrate 14.

The mobile mass 12 has a frame 15, in the example substantially rectangular in the horizontal plane xy, which internally defines a window or opening 16; the same mobile mass 12 also comprises a first and a second detection portion 12a, 12b, which extend inside the window 16 from the frame 15, suspended in cantilever fashion with respect to the substrate 14, having in the example a substantially trapezoidal shape, with oblique sides extending radially towards the center O.

The mobile mass 12 is elastically coupled to a single anchorage structure 20 (which will be described in greater detail below), arranged centrally to the window 16 and integral with the substrate 14, by means of anchoring elastic elements 18, having linear extension along the second horizontal axis y and yielding to bending in the horizontal plane xy and to torsion around the same second horizontal axis y.

The frame 15 of the mobile mass 12 is provided by overlying of the aforementioned first and second structural layers, indicated by L1 and L2 in FIG. 3, while the first and the second detection portions 12a, 12b are provided only in the second structural layer L2 (arranged at a greater distance with respect to the top surface 14a of the substrate 14).

In particular, the frame 15 has, at the coupling with the first and the second detection portions 12a, 12b, below the same detection portions, a substantially vertical wall 17 with extension orthogonal to the horizontal plane xy (along the vertical axis z); this wall 17 has, in the horizontal plane xy, a section with a shape of an arc of a circle (as indicated by the dashed line in FIG. 2A).

The detection structure 11 also comprises a first and a second driving masses 22a, 22b, arranged on opposite sides of the frame 15 of the mobile mass 12 with respect to the first horizontal axis x, externally with respect to the same frame 15.

These driving masses 22a, 22b define a frame, internally to which first driving electrodes 23 are coupled, in an interdigitated arrangement with second driving electrodes 24, fixed and integral with the substrate. The aforementioned driving masses 22a, 22b are elastically coupled to anchors 25, integral with the substrate 14, by means of folded elastic elements 26, which allow their driving movement, in the example with a linear translation in opposite directions along the first horizontal axis x, due to biasing of the aforementioned first and second driving electrodes 23, 24.

The same driving masses 22a, 22b are coupled to the frame 15 of the mobile mass 12, on opposite sides with respect to the first horizontal axis x, by coupling elastic elements 27a, 27b, having in the example linear extension along the second horizontal axis y and yielding to bending in the horizontal plane xy and to torsion around the second horizontal axis y.

The detection structure 11 also comprises first and second stator elements 28a, 28b, arranged inside the window 16, on opposite sides with respect to the second horizontal axis y, arranged suspended above the substrate 14 and underneath the mobile mass 12, being formed in the first structural layer L1.

In particular, each stator element 28a, 28b comprises a respective detection portion 29a, 29b arranged suspended above the top surface 14a of the substrate 14, facing and underneath a respective detection portion 12a, 12b of the mobile mass 12, to form a respective detection capacitor, with flat and parallel faces.

Each detection portion 29a, 29b has a shape substantially corresponding to the overlying respective detection portion 12a, 12b of the mobile mass 12, in the example being substantially trapezoidal, with a major base having a shape of an arc of a circle in the horizontal plane xy, so as to correspond to the facing wall 17 of the frame 15 of the mobile mass 12 (at the level of the first structural layer L1).

Each stator element 28a, 28b further comprises a respective connecting portion 30a, 30b, which is interposed, in the horizontal plane xy, between the respective detection portion 29a, 29b and the single anchorage structure 20 and is integrally coupled to the same single anchorage structure 20. In particular, these connecting portions 30a, 30b are separated in the horizontal plane xy from the single anchorage structure 20 by a separation trench 31.

In greater detail, in the illustrated embodiment, as also shown in FIG. 3, the aforementioned respective connecting portion 30a, 30b is coupled to an overlying top portion 20a of the single anchorage structure 20 (provided in the second structural layer L2) by a respective dielectric region 32, in particular of silicon oxide, which, in addition to defining the mechanical coupling, defines an electrical insulation between the stator elements 28a, 28b and the mobile mass 12 (rotor). This dielectric region 32 is therefore interposed in contact between facing surfaces of the aforementioned connecting portions 30a, 30b of the stator elements 28a, 28b and of the overlying top portion 20a of the single anchorage structure 20.

The single anchorage structure 20 further comprises a bottom portion 20b, provided in the first structural layer L1, integrally coupled to the top portion 20a and also mechanically and electrically coupled to a conductive pad or track R for rotor connection arranged on the top surface 14a of the substrate 14.

As shown schematically in the same FIG. 3, each connecting portion 30a, 30b is also coupled to respective electrical anchors 34, distinct and separate with respect to the single anchorage structure 20, through respective electrical connection elements (or "electrical wires") 35.

In detail (see for example FIG. 2A), these electrical connection elements 35 are made of thin and long portions, serpentine-folded, in the example provided in the second structural layer L2, configured in such a way that they represent a completely negligible mechanical coupling between the respective connecting portion 30a, 30b and the electrical anchors 34.

In the illustrated embodiment, these electrical connection elements 35 have a first end mechanically and electrically coupled integrally to the underlying connecting portion 30a, 30b and a second end connected to a respective electrical anchor 34. Furthermore, for each connecting portion 30a, 30b two electrical anchors 34 (and respective electrical connection elements 35) are present, arranged on the opposite side with respect to the first horizontal axis x, in proximity to the single anchorage structure 20.

In particular, the electrical anchors 34 in this case vertically traverse the connecting portion 30a, 30b of the respective stator element 28a, 28b, from which they are separated by a separation trench 37.

The electrical anchors 34 are portions of the first structural layer L1 (and, in the present case, of the second structural layer L2), which are directly connected (by an epitaxial silicon connecting portion) to a respective underlying conductive pad or track (indicated by S1, S2 in FIG. 3) for stator-connection, arranged on the top surface 14a of the substrate 14.

Essentially, separate and distinct conductive paths are thus defined in the detection structure 11 for the electrical bias and the detection of the capacitive variation signal and in particular: first and second conductive paths for the electrical connection of the first and the second stator elements 28a, 28b, which comprise the aforementioned electrical anchors 34 and the respective stator-connection pad S1, S2, the respective electrical connection elements 35 and the connecting portion 30a, 30b of the stator elements 28a, 28b; and a third conductive path for the electrical connection of the mobile mass 12, which comprises the single anchorage structure 20 and the corresponding rotor-connection pad R and the anchoring elastic elements 18.

During operation, the driving movement of the driving structures 22a, 22b along the first horizontal axis x (in opposite directions) causes the rotation of the mobile mass 12 around the vertical axis z (and the center O); in particular, these driving movements are allowed by the deformation (bending) in the horizontal plane xy of the coupling elastic elements 27a, 27b and of the anchoring elastic elements 18.

In the presence of the angular velocity $\Omega_x$ around the first horizontal axis x, the mobile mass 12 also undergoes, due to the Coriolis effect, the rotation around the second horizontal axis y, causing its displacement out of the horizontal plane xy and a resulting differential capacitive variation of the detection capacitors formed between the same mobile mass 12 and the stator elements 28a, 28b; in particular, this detection movement is allowed by the deformation (torsion) of the anchoring elastic elements 18.

Advantageously, the presence of the single anchorage structure 20 substantially allows the relative displacements between rotor and stator due to stress or external stimuli to be eliminated.

Figure 4:
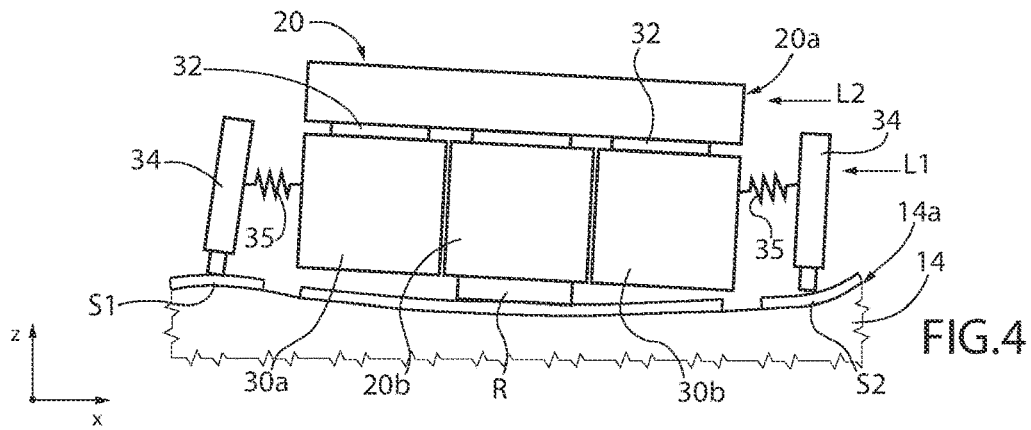
FIG. 4 is a schematic sectional view of the anchorage structure of FIG. 3, in the presence of a deformation of a corresponding substrate.

In particular, as shown schematically in FIG. 4, even in the presence of deformations of the substrate 14, for example due to a thermal stress associated with a positive temperature gradient, and of the resulting deformations of the top surface 14a of the same substrate 14, no corresponding movement substantially occurs between the mobile mass 12 and the stator elements 28a, 28b in the rest condition, in the absence of external angular velocity (in other words, there is no variation in the facing distance at rest). The aforementioned stator elements 28a, 28b and the mobile mass 12 are in fact forced to move together, in an integral manner, by virtue of the integral coupling to the single anchorage structure 20. As a result, advantageously, no undesired modification of the output signal at rest provided by the microelectromechanical gyroscope 10 occurs, as essentially no change in the "zero-g level" occurs.

It is also highlighted that possible deformations of the substrate 14 at the electrical anchors 34 (with respect to the position of the aforementioned single anchorage structure 20) are elastically absorbed, in a complete manner, by the electrical connection elements 35, without therefore affecting the same single anchorage structure 20 and again without causing undesired variations of the detection signal provided at output by the MEMS gyroscope 10.

Figure 5:
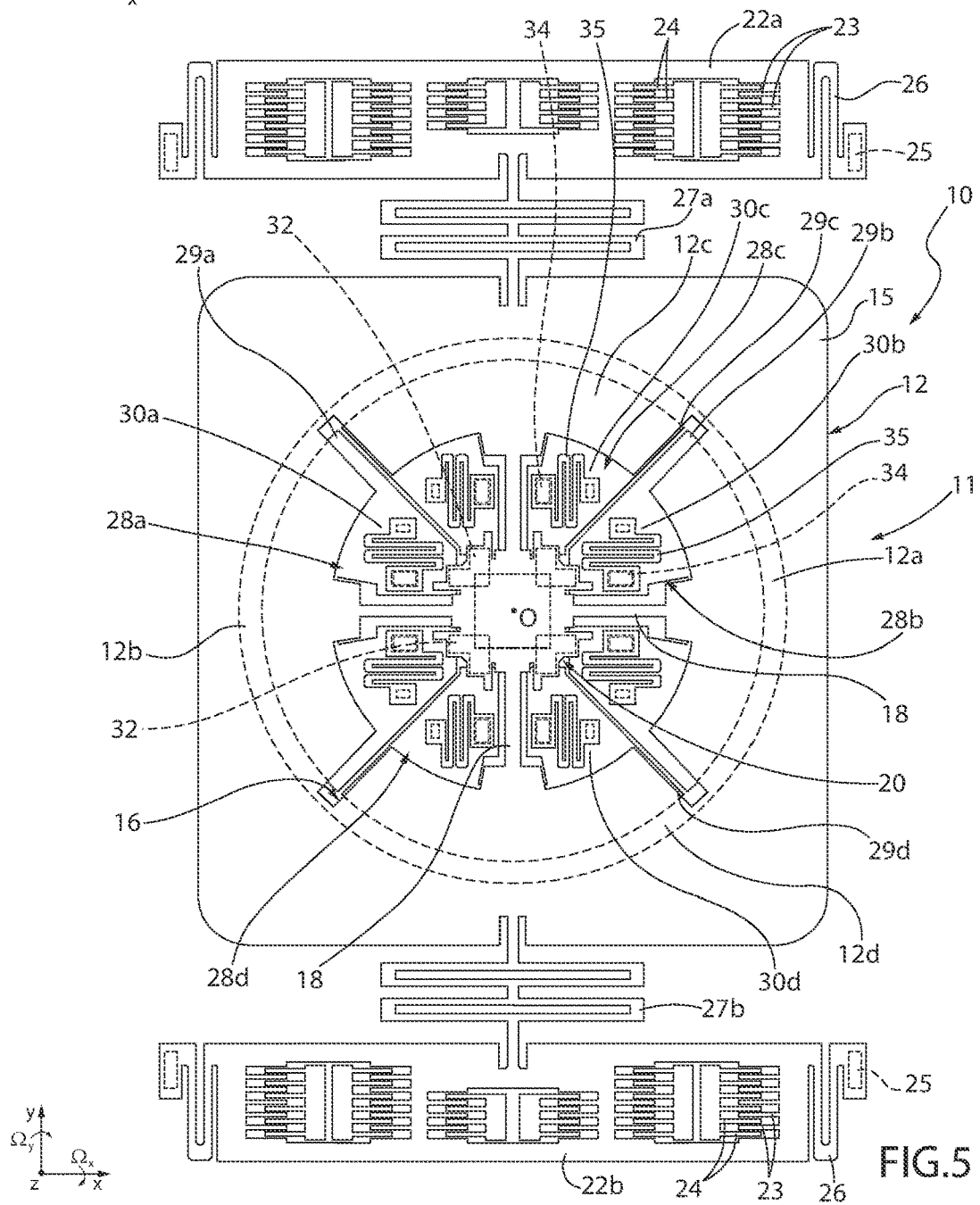
FIG. 5 is a schematic plan view of a detection structure of a MEMS gyroscope, according to a second embodiment of the present solution.

With reference to the plan view of FIG. 5, a second embodiment of the present solution is now described, relating to a MEMS gyroscope 10, of a biaxial type, for detecting the angular velocity $\Omega_x$ around the first horizontal axis x of the horizontal plane xy and also a further angular velocity $\Omega_y$ around the second horizontal axis y of the same horizontal plane xy.

As will be apparent from the examination of the aforementioned FIG. 5, the arrangement of the detection structure 11 is substantially equivalent to that previously described for the first uniaxial embodiment.

In this case, the mobile mass 12 further comprises third and fourth detection portions 12c, 12d, which extend from the frame 15 inside the window 16, suspended in a cantilever fashion with respect to the substrate 14, in this case having substantially a shape of an arc of a circle in the horizontal plane xy (the first and second detection portions 12a, 12b also having here the same shape of an arc of a circle).

In this case, the mobile mass 12 is elastically coupled to the single anchorage structure 20 by further anchoring elastic elements 18, having linear extension along the first horizontal axis x of the horizontal plane xy and yielding to bending in the horizontal plane xy and to torsion around the same first horizontal axis x. It should be noted that in this embodiment, the anchoring elastic elements 18 extend from a respective detection portion 12a-12d towards the single anchorage structure 20.

The detection structure 11 also comprises third and fourth stator elements 28c, 28d, arranged inside the window 16, on opposite sides with respect to the first horizontal axis x, arranged suspended above the substrate 14 and underneath the inertial mass 12, being formed again in the first structural layer L1.

In particular, each stator element 28c, 28d comprises a respective detection portion 29c, 29d arranged suspended above the top surface 14a of the substrate 14, facing underneath a respective detection portion 12c, 12d of the mobile mass 12, to form a respective detection capacitor, having flat and parallel faces.

Each further stator element 28c, 28d also in this case comprises a respective connecting portion 30c, 30d, which is interposed, in the horizontal plane xy, between the respective detection portion 29c, 29d and the single anchorage structure 20, being integrally coupled to the same single anchorage structure 20.

Similarly to what has been previously discussed, each connecting portion 30c, 30d is coupled to an overlying top portion 20a of the single anchorage structure 20 (provided in the second structural layer L2) through a dielectric region 32, in particular of silicon oxide.

As previously described, each connecting portion 30c, 30d is also coupled to respective electrical anchors 34, distinct and separate with respect to the single anchorage structure 20, through respective electrical connection elements 35. Again, these electrical connection elements 35 have a first end mechanically and electrically coupled integrally to the underlying connecting portion 30c, 30d and a second end connected to a respective electrical anchor 34, being provided in the second structural layer L2.

It should be noted that in this embodiment the connecting portions 30a-30d of the respective stator elements 28a-28d are traversed in the horizontal plane xy by the anchoring elastic elements 18.

In particular, in this embodiment, four dielectric regions 32 are present, arranged at the vertices of the single anchorage structure 20 (in this case having a substantially square section in the horizontal plane xy), each dielectric region 32 integrally coupling two connecting portions 30a-30d of adjacent stator elements 28a-28d to the top portion 20a of the single anchorage structure 20.

Moreover, in this second embodiment, the coupling elastic elements 27a, 27b, which elastically couple the driving masses 22a, 22b to the mobile mass 12, have a folded shape, to allow the rotation of the mobile mass 12 not only around the second horizontal axis y but also around the first horizontal axis x of the horizontal plane xy.

The operation of the detection structure 11 does not substantially vary with respect to what has been previously described, except in that the mobile mass 12, in the presence of the angular velocity $\Omega_y$ around the second horizontal axis y, also undergoes, due to the Coriolis effect, the rotation around the first horizontal axis x, causing a differential capacitive variation of the detection capacitors formed between the same mobile mass 12 and the further stator elements 28c, 28d; in particular, this detection movement is allowed by the torsional deformation of the further anchoring elastic elements 18.

Advantageously, the detection movements of the mobile mass due to the angular velocities $\Omega_x$ around the first horizontal axis x and $\Omega_y$ around the second horizontal axis y are substantially decoupled.

Figure 6:
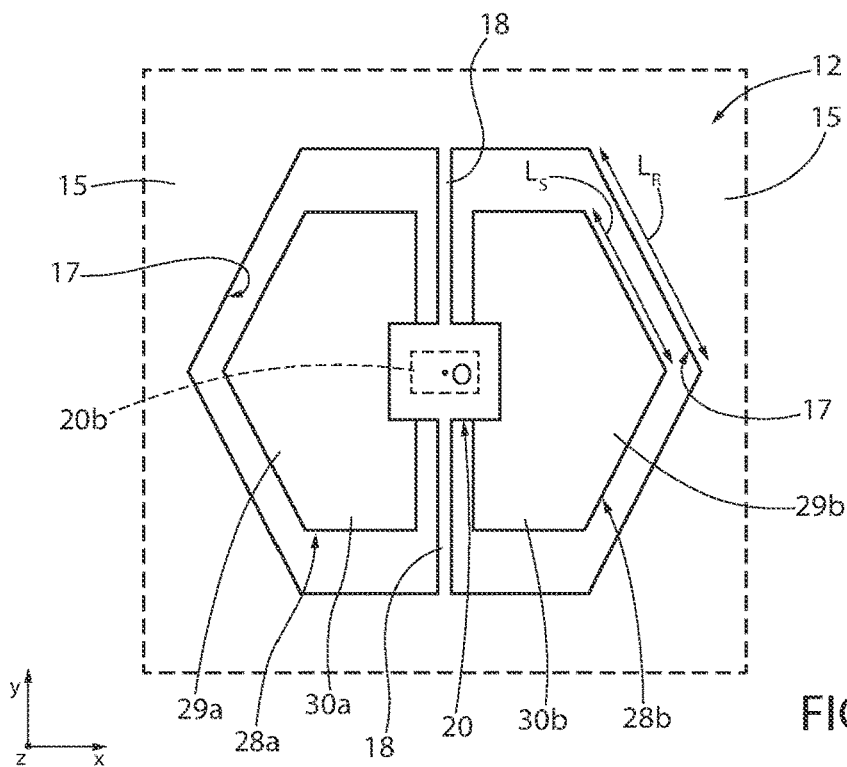
FIG. 6 is a schematic plan view of a portion of a detection structure of a MEMS gyroscope, according to a further embodiment of the present solution.

A further variant embodiment, which is schematically illustrated in FIG. 6, provides for a different shape, in the horizontal plane xy, of the facing surfaces of the frame 15 of the mobile mass 12 and of the stator elements 28a, 28b (what described may be similarly applied to the stator elements 28c, 28d), in particular of the corresponding detection portions 29a, 29b.

In this embodiment, these facing surfaces have, in the horizontal plane xy, a shape of a regular polygon, rather than of an arc of a circumference.

In the example shown in the aforementioned FIG. 6, the stator elements 28a, 28b jointly define, in the horizontal plane xy, a regular hexagon. Correspondingly, the frame 15 also has internally a surface facing the aforementioned stator elements 28a, 28b having an overall hexagonal shape in the horizontal plane xy.

The working principle of the detection structure 11 does not vary in this embodiment with respect to what has been previously discussed. However, a suitable dimensional design may be required, in order to avoid a possible impact between the aforementioned facing surfaces during the driving movement of the mobile mass 12.

For example, in the aforementioned hexagonal case, in case the following relationship is met between facing sides $L_R$ and $L_S$ respectively of the aforementioned frame 15 of the mobile mass 12 and of the aforementioned stator elements 28a, 28b:

$$L_R \leq 2/\sqrt{3} L_S,$$

the driving rotation angle for the mobile mass 12 around the vertical axis z is to be smaller than or equal to 30°, in order to avoid the aforementioned impacts between facing surfaces.

As a result, the circular shape in the horizontal plane xy for the aforementioned facing surfaces is in any case preferable and advantageous, since it ensures, in all conditions, the absence of impacts between the same facing surfaces during the driving of the mobile mass 12.

The circular shape also avoids the presence of possible electrical common modes due to a variation of the facing surfaces, a variation that might conversely occur in case of polygonal embodiments (in the presence of a non-perfect symmetry of the detection structure 11).

Figure 7:
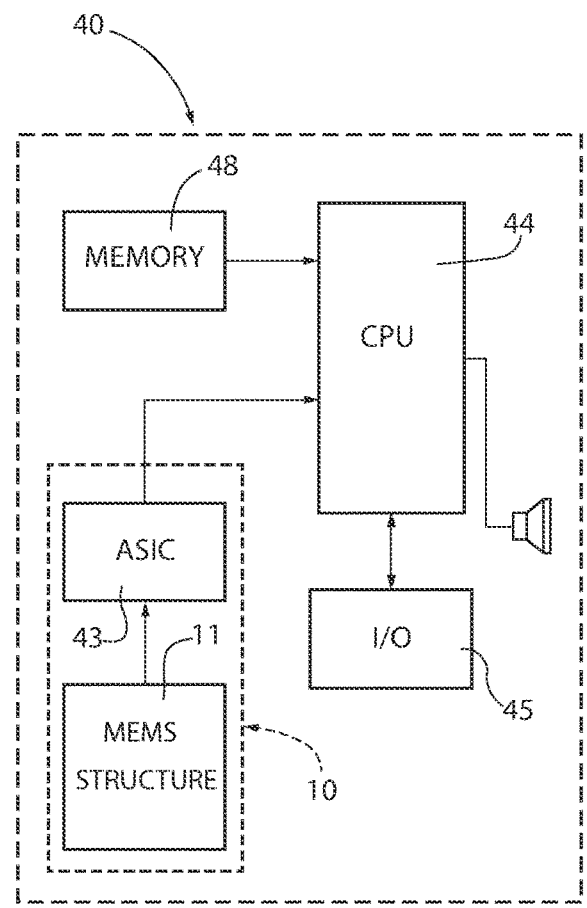
FIG. 7 is a schematic block diagram of an electronic apparatus incorporating a MEMS sensor device according to a further aspect of the present solution.

With reference to FIG. 7, an electronic apparatus 40 is now described, wherein the microelectromechanical gyroscope 10 may be used.

The microelectromechanical gyroscope 10 includes, in addition to the aforementioned detection structure 11, an ASIC circuit 43 which provides the corresponding reading interface (and which may be made in the same die wherein the detection structure 11 is provided or in a different die, which may in any case be accommodated in a same package).

The electronic apparatus 40 is for example a portable mobile communication apparatus, such as a mobile phone, a PDA (Personal Digital Assistant), a portable computer, but also a digital audio player with voice recording capability, a photo or video camera, a video game controller, etc.; the electronic apparatus 40 is generally capable of processing, storing and/or transmitting and receiving signals and information.

The electronic apparatus 40 comprises a microprocessor (CPU) 44, which receives the signals detected by the microelectromechanical gyroscope 10, and an input/output interface 45, for example provided with a keyboard and a display, connected to the microprocessor 44. Moreover, the electronic apparatus 40 may comprise an internal memory 48, operatively coupled to the microprocessor 44.

The advantages of the microelectromechanical gyroscope according to the present solution are clear from the previous description.

In any case, it is again underlined that the present solution substantially allows to cancel the drifts of the electrical performances of the detection structure 11 caused by the deformations of the substrate 14, due to external stresses and stimuli, for example due to temperature variations or mechanical stresses, for example resulting from soldering to a printed circuit board or other causes (such as aging or absorption of humidity).

The detection structure 11 is thus extremely stable, regardless of the operating conditions and assembly in the corresponding package.

Moreover, the general detection performances, in terms of sensitivity, for example, do not vary with respect to traditional solutions, since the detection principle is not modified, just as the shape and arrangement of the detection electrodes with respect to the inertial mass are not substantially modified.

Finally, it is clear that modifications and variations may be made to what is described and illustrated herein without thereby departing from the scope of the present disclosure.

In particular, it is apparent that the detection structure 11 of the microelectromechanical gyroscope 10, of uniaxial type, may be arranged in the horizontal plane to detect an angular velocity around the second horizontal axis y (rather than around the first horizontal axis x), in a manner completely analogous to what has been previously discussed (in this case, only the third and the fourth detection portions 12c, 12d of the mobile mass and the coupled third and fourth stator elements 28c, 28d being present).

Some features of the detection structure 11 may also vary, without this entailing substantial modifications to the proposed solution. For instance, as on the other hand already indicated above, a different shape in the horizontal plane xy of the stator elements 28a-28d and of the frame 15 of the mobile mass 12 might be provided.

A microelectromechanical gyroscope (10) having a detection structure (11) may be summarized as including a substrate (14) with a top surface (14a) parallel to a horizontal plane (xy); a mobile mass (12), suspended above the substrate (14) and configured to perform, as a function of a first angular velocity ($\Omega_x$) around a first axis (x) of said horizontal plane (xy), at least a first detection movement of rotation around a second axis (y) of said horizontal plane; and a first and a second stator elements (28a, 28b) fixed to the substrate (14) and arranged underneath said mobile mass (12) to define with said mobile mass (12) a capacitive coupling, a capacitance value thereof being indicative of said first angular velocity ($\Omega$),), characterized in that said detection structure (11) includes a single mechanical anchorage structure (20) for anchoring both said mobile mass (12) and said stator elements (28a, 28b) to said substrate (14), arranged internally with respect to said mobile mass (12) in said horizontal plane (xy); said mobile mass (12) being coupled to said single mechanical anchorage structure (20) by coupling elastic elements (18), yielding to torsion around said second axis (y); and said stator elements (28a, 28b) being integrally coupled to said single mechanical anchorage structure (20) in a suspended arrangement above said top surface (14a) of said substrate (14).

Said mobile mass (12) may include a frame (15) internally defining a window (16) and a first and a second detection portions (12a, 12b), which extend internally to the window (16) from the frame (15), suspended with respect to the substrate (14); and said stator elements (28a, 28b) may include a respective detection portion (29a, 29b) arranged suspended above the top surface (14a) of the substrate (14), facing underneath a respective detection portion (12a, 12b) of the mobile mass (12), to form a respective detection capacitor.

The gyroscope may include a first and a second structural layers (L1, L2), superimposed on each other and arranged above said substrate (14); wherein said first and second detection portions (12a, 12b) of said mobile mass (22) may be formed in said second structural layer (L2), arranged at a greater distance with respect to said top surface (14a) of the substrate (14); and said stator elements (28a, 28b) may be formed in said first structural layer (L1), arranged at a smaller distance with respect to said top surface (14a) of the substrate (14).

Said stator elements (28a, 28b) may further include a respective connecting portion (30a, 30b), that is interposed, in the horizontal plane xy, between the respective detection portion (29a, 29b) and the single anchorage structure (20); wherein said connecting portions (30a, 30b) may be integrally coupled to an overlying top portion (20a) of the single anchorage structure (20), provided in said second structural layer (L2), through a respective dielectric region (32), that is interposed in contact between facing surfaces of said connecting portions (30a, 30b) and of said overlying top portion (20a) of the single anchorage structure (20).

Said single anchorage structure (20) may further include a bottom portion (20b), provided in the first structural layer (L1), integrally coupled to the top portion (20a) and mechanically and electrically coupled to a rotor-connection conductive element (R) arranged on said top surface (14a) of the substrate (14); the connecting portions (30a, 30b) of said stator elements (28a, 28b) being separated from said bottom part (20b) by a separation trench (31) in said horizontal plane (xy).

Said detection portions (29a, 29b) of said stator elements (28a, 28b) may face, at a distance in the horizontal plane (xy), a wall (17) of the frame (15) of said mobile mass (12); wherein the facing surfaces of said detection portions (29a, 29b) and of said frame (15) may have, in the horizontal plane (xy), a shape of an arc of a circle.

Said connecting portions (30a, 30b) of said stator elements (28a, 28b) may be coupled to respective electrical anchors (34), distinct and separate with respect to the single anchorage structure (20), through respective electric connection elements (35) configured so as to constitute a negligible mechanical coupling.

Said electrical connection elements (35) may be provided in said second structural layer (L2) and may have a first end mechanically and electrically coupled to an underlying connecting portion (30a, 30b) of said stator elements (28a, 28b) and a second end connected to a respective electrical anchor (34); and said electrical anchors (34) may be mechanically and electrically coupled to respective stator-connection conductive elements (S1, S2) arranged on said top surface (14a) of the substrate (14).

The detection structure (11) may define: a first and a second conductive paths for the electrical connection of the first and the second stator elements (28a 28b), may include said electrical anchors (34) and the respective stator-connection conductive elements (S1, S2), the respective electrical connection elements (35) and the respective connecting portion (30a, 30b); and a third conductive path for the electrical connection of the mobile mass (12), which may include said single anchorage structure (20), a corresponding rotor-connection conductive element (R) and said anchoring elastic elements (18).

Said first and second structural layers (L1, L2) may be epitaxial silicon layers grown above the top surface (14a) of said substrate (14), at least partially electrically and/or mechanically decoupled from each other.

Said mobile mass (12) may further include performing a second detection movement of rotation around the first axis (x) of said horizontal plane (xy), as a function of a second angular velocity ($\Omega_y$) around the second axis (y) of said horizontal plane (xy); may further include a third and a fourth stator elements (28c, 28d) suspended above the substrate (14) and underneath said mobile mass (12) and defining with said mobile mass (12) a capacitive coupling, a capacitance value thereof being indicative of said second angular velocity ($\Omega_y$).

Said mobile mass (12) may further include a third and a fourth detection portions (12c, 12d), which extend from the frame (15) inside the window (16), suspended with respect to the substrate (14), facing said third and, respectively, fourth stator elements (28c, 28d); and said mobile mass (12) may be elastically coupled to the single anchorage structure (20) by further anchoring elastic elements (18), yielding to torsion around said first horizontal axis (x).

Said anchoring elastic elements (18) may have linear extension along the first or second horizontal axes (x, y) of the horizontal plane (xy) and are also yielding to bending in the horizontal plane (xy).

The gyroscope may further include a first and a second driving masses (22a, 22b), arranged externally to the frame (15) of the mobile mass (12) and coupled to the frame (15) through coupling elastic elements (27a, 27b), yielding to bending in the horizontal plane (xy); said driving masses (22a, 22b) defining a respective frame, internally to which first driving electrodes (23) are coupled in an interdigitated arrangement to second driving electrodes (24), fixed and integral with the substrate (14), and being elastically coupled to the substrate (14) to perform a linear translation driving movement, in response to biasing of said first and second driving electrodes (23, 24).

An electronic device (40), may be summarized as including the microelectromechanical gyroscope (10), and a processing unit (44) coupled to the microelectromechanical gyroscope (10) and configured to receive detection signals indicative of said first angular velocity ($\Omega_x$).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical gyroscope, comprising:
a substrate with a top surface;
a mobile mass suspended over the substrate;
first and second stator elements suspended between the mobile mass and the top surface of the substrate;
a central mechanical anchorage structure coupled to the substrate, the central anchorage structure including a first portion coupled to the substrate, the first portion being between the first and second stator elements in a first direction, the central anchorage structure including a second portion that is coupled to the first and second stator elements, the first portion being between the second portion and the substrate in a second direction that is transverse to the first direction; and
elastic elements coupling the mobile mass to the central mechanical anchorage structure.

2. The gyroscope according to claim 1, wherein said mobile mass comprises:
a frame having a window; and
first and second detection portions extending from the frame to the window the first and second stator elements having respective detection portions facing the first and second detection portions, respectively, of the mobile mass.

3. The gyroscope according to claim 2, comprising first and second structural layers on each other, the first structural layer has a smaller distance from the top surface of substrate in the second direction than the second structural layer has from the top surface of the substrate in the second direction, the first and second detection portions of said mobile mass are in said second structural layer, and said first and second stator elements are in said first structural layer.

4. The gyroscope according to claim 3, wherein the first and second stator elements comprise respective connecting portions between the respective detection portions of the first and second stator elements and the central mechanical anchorage structure, the connecting portions are coupled by a respective dielectric region to the second portion of the central mechanical anchorage structure in said second structural layer.

5. The gyroscope according to claim 4, wherein the first portion is in the first structural layer, coupled to the second portion and mechanically and electrically coupled to a rotor-connection conductive element on said top surface of the substrate, the connecting portions of said first and second stator elements being separated from the first portion by a trench.

6. The gyroscope according to claim 5, wherein said detection portions of said first and second stator elements extend towards a wall of the frame of said mobile mass, the wall having a shape of an arc of a circle.

7. The gyroscope according to claim 5, comprising electrical connection elements in the second structural layer and having first ends mechanically and electrically coupled to the connecting portions of said first and second stator elements, and second ends connected to a respective electrical anchor being mechanically and electrically coupled to respective stator-connection conductive elements on said top surface of the substrate.

8. The gyroscope according to claim 7, comprising first and second conductive paths for electrical connection of the first and the second stator elements, the respective electrical anchor, the respective stator-connection conductive elements, the respective electrical connection elements and the respective connecting portions; and
a third conductive path for electrical connection of the mobile mass, the mechanical anchorage structure, the rotor-connection conductive element and the elastic elements.

9. A device, comprising:
a substrate;
a central anchor in a central region of the substrate, a first portion of the central anchor coupled to the substrate, the central anchor having a second portion opposite the first portion;
a mobile mass including:
a first outer edge opposite a second outer edge;
a central opening between the first and second outer edge, the central anchor in the central opening, the mobile mass coupled to the second portion of the central anchor;
a protrusion extending from the first edge into the central opening towards the central anchor, the protrusion having a first end spaced from and adjacent the central anchor;
a stator element being suspended between the protrusion and the substrate, the stator element coupled to the central anchor by a dielectric region on a first surface of the central anchor that is facing the substrate;
an electrical anchor on the substrate and in the central opening of the mobile mass, the electrical anchor coupled to the stator element;
a first elastic element in the central opening coupling the mobile mass to the central anchor, the first elastic element extending from the second portion of the central anchor to the mobile mass;
a driving mass coupled to the substrate; and
a second elastic element coupling the driving mass to the mobile mass.

10. The device according to claim 9, wherein the mobile mass has a first surface facing the substrate, the first surface having a wall facing the central opening, the wall having a concave curvature, the protrusion extending from the wall.

11. The device according to claim 10, wherein a first side of the stator element extends towards, and has the substantially same shape as, the wall in the first surface of the mobile mass.

12. The device according to claim 11, wherein the first and second elastic elements are spaced from each other by the mobile mass.

13. The device according to claim 12, wherein the second portion of the central anchor includes a first side coupled to the mobile mass, the first side transverse to a second side of the central anchor, the second side facing the protrusion of the mobile mass.

14. The device according to claim 13, wherein portions of the stator element are located in the central opening of the mobile mass.

15. A device, comprising:
a substrate;
a fixed mechanical structure;
a mobile mass including:
an opening that includes a main body aligned with the fixed mechanical structure and a plurality of extensions away from the main body; and
a first surface opposite a second surface, the first surface of the mobile mass facing the substrate, a first side of the mobile mass being between a first and second one of the plurality of extensions of the opening and a second side of the mobile mass being between a third and fourth one of the plurality of extensions of the opening; and
first and second stator elements coupled to of the fixed mechanical structure, the first stator element being between the first side of the mobile mass and the substrate, and the second stator element being between the second side of the mobile mass and the substrate.

16. The device according to claim 15, comprising connection elements coupled between the stator elements and electrical anchors on the substrate, and the connection elements being in the opening of the mobile mass.

17. The device according to claim 16, comprising elastic assemblies, first ones of the elastic assemblies coupling the mobile mass to the fixed mechanical structure.

18. The device according to claim 17, comprising driving masses coupled to the mobile mass via second ones of the elastic assemblies, the driving masses located at opposite ends of the mobile mass.

19. The device according to claim 18, wherein the driving masses include first and second driving electrodes fixed to the substrate, the first and second driving electrodes being adjacent to each other in a pattern.

20. The device according to claim 19, wherein the driving mass are elastically coupled to the substrate via folded elastic elements.

* * * * *